(12) United States Patent
Kim et al.

(10) Patent No.: US 6,328,043 B1
(45) Date of Patent: Dec. 11, 2001

(54) FILTERING TECHNIQUE FOR CVD CHAMBER PROCESS GASES

(75) Inventors: Young-Roe Kim, Kyunggi-do; Hyun-Young Kim, Seoul; Hyun-kuk Ko; Kyung-Burn Koo, both of Kyunggi-do; Ju-Wan Kim, Seoul; Hyong-Soo Kim, Kyunggi-do; Dong-chan Park, Kyunggi-do; Dong-Geun Na, Kyunggi-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/315,340

(22) Filed: May 20, 1999

(30) Foreign Application Priority Data

May 20, 1998 (KR) .................................. 98-18166
May 29, 1998 (KR) .................................. 98-19872

(51) Int. Cl.$^7$ ....................................... B08B 5/00
(52) U.S. Cl. ...................... 134/22.1; 156/345; 438/905
(58) Field of Search ............... 134/1.1, 1.2, 22.1, 134/22.11, 42; 438/905; 216/67; 118/70; 156/345

(56) References Cited

U.S. PATENT DOCUMENTS

| | | | |
|---|---|---|---|
| 3,777,364 | 12/1973 | Schinella et al. ............... | 438/558 |
| 4,869,301 | * 9/1989 | Ohmi et al. ..................... | 137/240 |
| 4,917,136 | * 4/1990 | Ohmi et al. ..................... | 137/15 |
| 5,637,153 | * 6/1997 | Niino et al. ..................... | 134/22.11 |
| 5,709,757 | * 1/1998 | Hatano et al. ................... | 134/22.14 |
| 5,954,887 | * 9/1999 | Hatano ............................ | 134/2 |
| 6,042,654 | * 3/2000 | Comita et al. .................. | 134/2 |
| 6,143,128 | * 11/2000 | Meen et al. ..................... | 156/345 |

* cited by examiner

Primary Examiner—Randy Gulakowski
Assistant Examiner—Saeed Chaudhry
(74) Attorney, Agent, or Firm—Volentine Francos, PLLC (57) ABSTRACT

A method and an apparatus for removing particulate contaminant are provided in order to ensure high purity during a tungsten suicide deposition process. The method for removing particulate contaminant in tungsten silicide deposition process using $SiH_4$ as silicon source gas and $NF_3$ as cleaning gas, includes purging a carrier gas line for an $SiH_4$ silicon source gas to remove the contaminant in the chamber and carrier gas line when the carrier gas is supplied with the chamber, and the $NF_3$ cleaning gas is supplied to the chamber to form plasma. After a plasma cleaning, the gas line flowing reaction gas responding to the $SiH_4$ is purged to remove the contaminant in the chamber and the reaction gas line. As a result, any particulate contaminant is removed or remains at a minimum level that has no effect on the tungsten silicide deposition process.

20 Claims, 6 Drawing Sheets

FILTERING TECHNIQUE FOR CVD CHAMBER PROCESS GASES

This application relies for priority upon Korean Patent Application No. 98-18166, filed on May 20, 1998, and Korean Patent Application No. 98-19872, filed on May 29, 1998, the contents of both of which are herein incorporated by reference in their entirety.

BACKGROUND OF THE INVENTION

1. Field of the Invention

The present invention relates to a semiconductor. More particularly, the present invention relates to a method and apparatus for removing particulate contamination in a tungsten silicide deposition process.

2. Discussion of the Related Art

In providing electrical connections to silicon for microelectronic applications, it is frequently desired to provide a conductive interface between a metallization layer, such as aluminum (Al), and a portion of a silicon substrate or layer to be electrically connected to the aluminum, in order to prevent the direct contact of the aluminum with the silicon. The reason for this is that if aluminum were to be directly deposited onto the silicon, various problems may arise.

One significant problem in depositing aluminum directly on silicon is that the aluminum acts as a P-type dopant, and any migration of aluminum atoms into a silicon region would dope the silicon region with P-type impurities. This is especially significant when the aluminum contacts an N-type silicon region, where the migration of P-type aluminum atoms into the silicon region would result in an undesired rectifying contact.

One way to overcome the problems mentioned above is to form one or more interface layers over the silicon before the deposition of an aluminum metallization layer. This type of process is generally described in U.S. Pat. No. 3,777,364 to Schinella et al., although numerous other patents describe similar processes. In such a process, a refractory metal, such as tungsten, molybdenum, palladium, platinum, or tantalum, is deposited over and reacts with an exposed silicon (or polysilicon) substrate or layer to form a silicide layer. Once this silicidation process is completed, top portion of the deposited refractory metal that has not reacted with the silicon, may then be removed. Aluminum is then deposited over the silicide layer.

The resulting silicide layer formed between the aluminum and silicon acts as a barrier to the aluminum atoms, preventing migration of the aluminum into the silicon. The silicide layer also provides a low resistivity contact between the aluminum and the silicon. In addition, this type of process slightly reduces the step height of the resulting device.

A problem with the above method of forming a silicide layer is that, when tungsten silicide is used, for example, as the interface layer between aluminum and silicon, and a chemical vapor deposition (CVD) process employing tungsten hexafluoride($WF_6$) as a reactant gas is used, the high temperatures involved in the CVD process can cause the hot CVD chamber walls to react with the $WF_6$ gas. This results in a lowering of the deposition rate of the tungsten onto the surface of the wafer.

To avoid these problems, a cold-wall radiantly-heated chemical vapor deposition (CVD) system is preferably used to deposit the refractory metal. In such a system, each wafer is heated by, for example, a broad band light source. As a result, the deposition of the refractory metal onto the wafer to form a barrier layer between the silicon substrate and an aluminum layer will not be limited by any reaction of process gases (e.g., $WF_6$) with high-temperature chamber walls.

Figure 1:
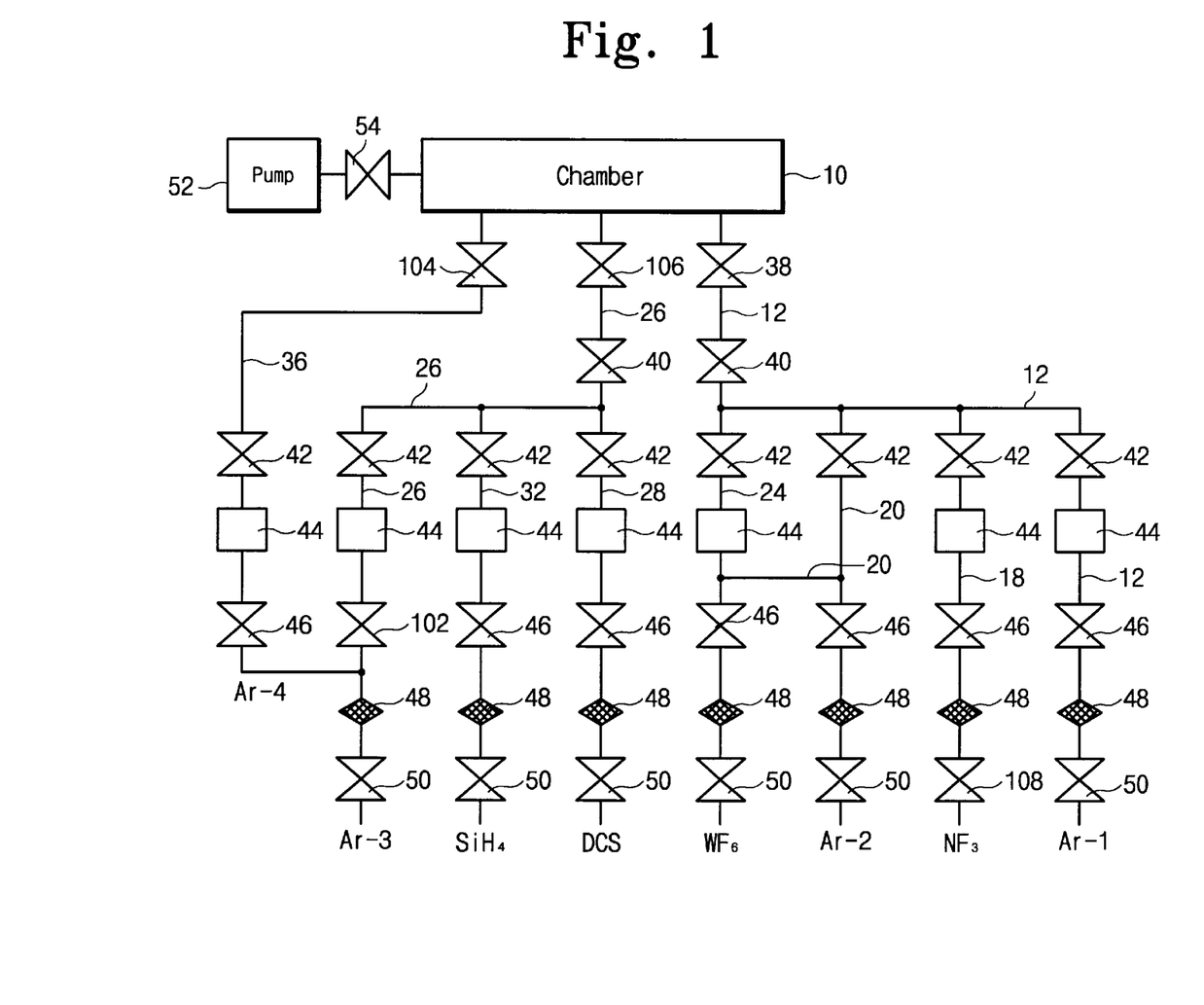
FIG. 1 is a diagram showing a conventional chemical vapor deposition system.

A representative CVD system is shown in FIG. 1. The CVD system includes an Ar-1 gas line 12, an $NF_3$ cleaning gas line 18, an Ar-2 carrier gas line 20, a $WF_6$ reaction gas line 24, an Ar-3 carrier gas line 26, an $SiH_4$ source gas line 32, and an Ar-4 gas line 36. The gas lines are engaged with a gas tank (not shown) containing each gas. The gas lines have valves 38, 40, 42, 46, 50, 102, 104, 106 and 108, and a mass flow controller (MFC) 44, activated by a controller (not shown), to control the flow and flow rate of the various gases.

The gas lines 12, 18, 20, 24, 26, and 32 also include a plurality of filters 48, which filter gas passing through the gas lines 12, 18, 20, 24, 26, 28, and 32. A holding apparatus (not shown), e.g., a chuck, is provided to load the wafers to be processed and is set up in the chamber 10. An apparatus for controlling the pressure, such as a pump 52 and valve 54, is also provided to control the pressure within the chamber 10. Through the $SiH_4$ source gas line 32, $SiH_4$ silicon source gas is supplied to the chamber 10.

A different kind of silicon source gas, such as dichlorosilane ($SiH_2Cl_2$ or DCS), may also be used in accordance with this process. Thus a gas line 28 for DCS may be formed parallel to the source gas line 32. Such a gas line 28 will also have valves 42, 46, and 50, as well as an MFC 44.

The Ar-1, Ar-2, Ar-3, and Ar-4 gas lines 12, 36, 20, and 26, each provide argon (Ar) gas into the chamber 10. The Ar-1 and Ar-2 gas lines 12 and 20 supply argon gas into the upper part of the chamber 10; the Ar-3 gas line 26 supplies argon gas into the middle part of the chamber 10; and the Ar-4 gas line 36 supplies argon gas into the lower part of the chamber 10.

An argon carrier gas is supplied to the chamber 10 with the $SiH_4$ source gas and the DCS gas through the Ar-3 carrier gas line 26, which is connected to the $SiH_4$ gas line 32. The Ar-4 gas line 36 diverges from the Ar-3 carrier gas line 26 to provide a second source of argon gas to the chamber 10. The Ar-4 gas line 36 is constructed to be divided from the Ar-3 carrier gas line 26 prior to when the Ar-3 gas line 26 connects with the $SiH_4$ source gas line 32 and the DCS gas line 28.

The $WF_6$ reaction gas line 24, the Ar-2 carrier gas line 20, and the $NF_3$ cleaning gas line 18 are all coupled to the Ar-1 carrier gas line 12. An argon (Ar) carrier gas is supplied to the chamber 10 through the Ar-2 carrier gas line 20, and the Ar-1 carrier gas line 12, which is coupled to upper part of the chamber 10. The $NF_3$ cleaning gas is supplied to the chamber 10 through gas lines 18 and 12.

To ensure the purity of a deposition film, the chamber 10 is conventionally cleaned by forming plasma using $NF_3$ after the deposition process. Despite the fact that the chamber 10 is cleaned before the deposition process, a contamination problem on deposition film of the wafer by unknown particulate contaminant continuously happens during deposition process. As a result, residual gas in the chamber is analyzed by a residual gas analyzer (not shown) in order to find any source of particulate contaminant. By making use of the residual gas analyzer, the pressure of each compound of the residual gas is measured.

Figure 2:
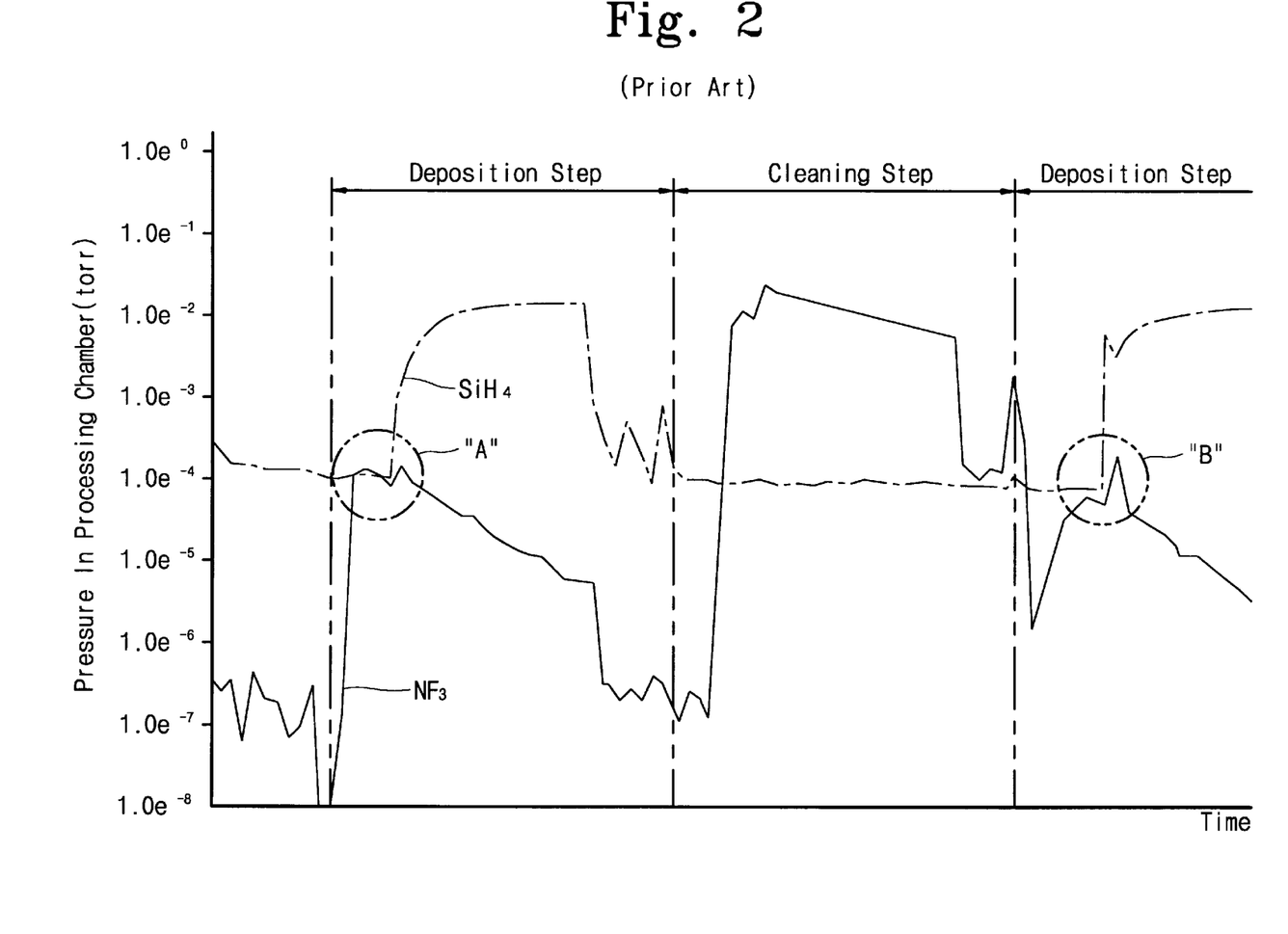
FIG. 2 is a graph detecting the pressure of gas in the chamber of FIG. 1, by making use of a residual gas analyzer.

FIG. 2 is a graph detecting the pressure of gas in the chamber 10 by making use of a residual gas analyzer. The fluctuation of the pressure of $SiH_4$ silicon source gas is shown in a regular pattern in which the pressure of the $SiH_4$ rises during the deposition step and remains at a constant level (e.g., $1 \times 10^{-4}$ Torr) during the cleaning step. However, the pressure of $NF_3$ experiences an irregular pattern in some regions such as during the initial deposition step. Especially sudden ascents of the pressure of $NF_3$ (shown in the circles "A" and "B" in FIG. 2) in the initial deposition step means that some $NF_3$ gas remains in the gas line connected with the chamber 10 after the cleaning step.

The $NF_3$ gas is used to clean the chamber 10 by forming the plasma and may remain in the chamber 10 and gas line 12 rather than being completely eliminated from the chamber. In this case, during as initial deposition step, residual $NF_3$ gas in the gas line 12 will be inserted in the chamber with other gas and will react with $SiH_4$ to produce $SiF_x$, which acts as a particulate contaminant during the tungsten silicide deposition process.

It would, therefore, be desirable to provide a method and an apparatus for removing particulate contaminants in a tungsten silicide deposition process by forcing the $NF_3$ gas to be fully excluded or to remain at a minimum level, so that it has no effect within the chamber 10 between the cleaning step and the deposition step.

SUMMARY OF THE INVENTION

It is an object of the present invention to provide a method for removing particulate contaminants in a semiconductor manufacturing process using gas supplied to a chamber through a gas line, comprising cleaning the gas line, and cleaning the chamber. In this way, particulate contamination caused by residual gas in the chamber or gas line is prevented during the deposition process. The gas line allows a source gas, used in the manufacturing semiconductor process, and a cleaning gas, used to clean the chamber, to flow together. The gas line is preferably cleaned by a gas flow, more preferably by flowing a carrier gas through the gas line to compel the removal of any remaining source gas. In this method, the gas line is preferably cleaned after the chamber is cleaned.

In addition, a method is also provided for removing particulate contaminants in a silicide deposition process, comprising flowing a silicon source gas into a chamber through a first carrier gas line, purging the first carrier gas line to remove contaminants from the chamber and the first carrier gas line by supplying a carrier gas to the chamber via a second carrier gas line, supplying a cleaning gas into the chamber, forming a plasma in the chamber from the cleaning gas, and purging a reaction gas line for flowing a reaction gas to remove any contaminants in the chamber and the reaction gas line. In this way, particulate contamination by the cleaning gas is prevented in the deposition process.

The method may also comprise purging the inner part of the chamber after purging the first carrier gas line, or purging the inner part of the chamber before and after supplying the cleaning gas into the chamber and forming a plasma in the chamber from the cleaning gas. The flowing of the silicon source gas into the chamber, purging the first carrier gas line to, supplying the cleaning gas, forming a plasma in the chamber, and purging the reaction gas line may be performed just before a deposition process, or may be performed periodically at regular time intervals when the chamber is in an idle state during which a deposition process is paused.

A chemical vapor deposition system for a silicide deposition process is also provided, comprising a chamber for performing a silicide deposition process, a first carrier gas line for supplying a carrier gas to the chamber, a source gas line connected to the first carrier gas line for supplying a silicon source gas to the first carrier gas line and to the chamber via the first carrier gas line, a second carrier gas line for supplying the carrier gas to the chamber, a reaction gas line connected to the second carrier gas line for supplying a reaction gas to the second carrier gas line and to the chamber via the second carrier gas line, and a purging device for preventing a cleaning gas from remaining in the second carrier gas line and the reaction gas line and from acting as a particulate contaminant during the silicide deposition process.

The purging device may comprise a cleaning gas line connected directly with the chamber to provide the cleaning gas to the chamber. The purging device may also comprise a cleaning gas line connected to the second carrier gas line for supplying the cleaning gas to the second carrier gas line and to the chamber via the second carrier gas line, an exhaust line connected to the second carrier gas line, and exhausting the cleaning gas from the reaction gas line, the second carrier gas line, and cleaning gas line, whereby the exhaust line is connected to the second carrier gas line adjacent to the cleaning gas line. Int his case, the exhaust line may be connected to a pump.

The second carrier gas line preferably provides the reaction gas, carrier gas, and cleaning gas to an upper zone of the chamber. The system may further comprise a third carrier gas line divided from the first carrier gas line before the first carrier gas line is connected with the source gas line, the third carrier gas line being connected to the chamber to provide the carrier gas to a bottom zone of the chamber.

Preferably, the silicon source gas is $SiH_4$, the cleaning gas is $NF_3$, the reaction gas is $WF_6$, and the carrier gas is argon.

DESCRIPTION OF THE PREFERRED EMBODIMENT

To remove particulate contaminants, gases are purged through gas lines after each completed deposition process. To eliminate the particulate contaminants, a method for removing particulate contaminants is conducted after the deposition step.

Figure 3:
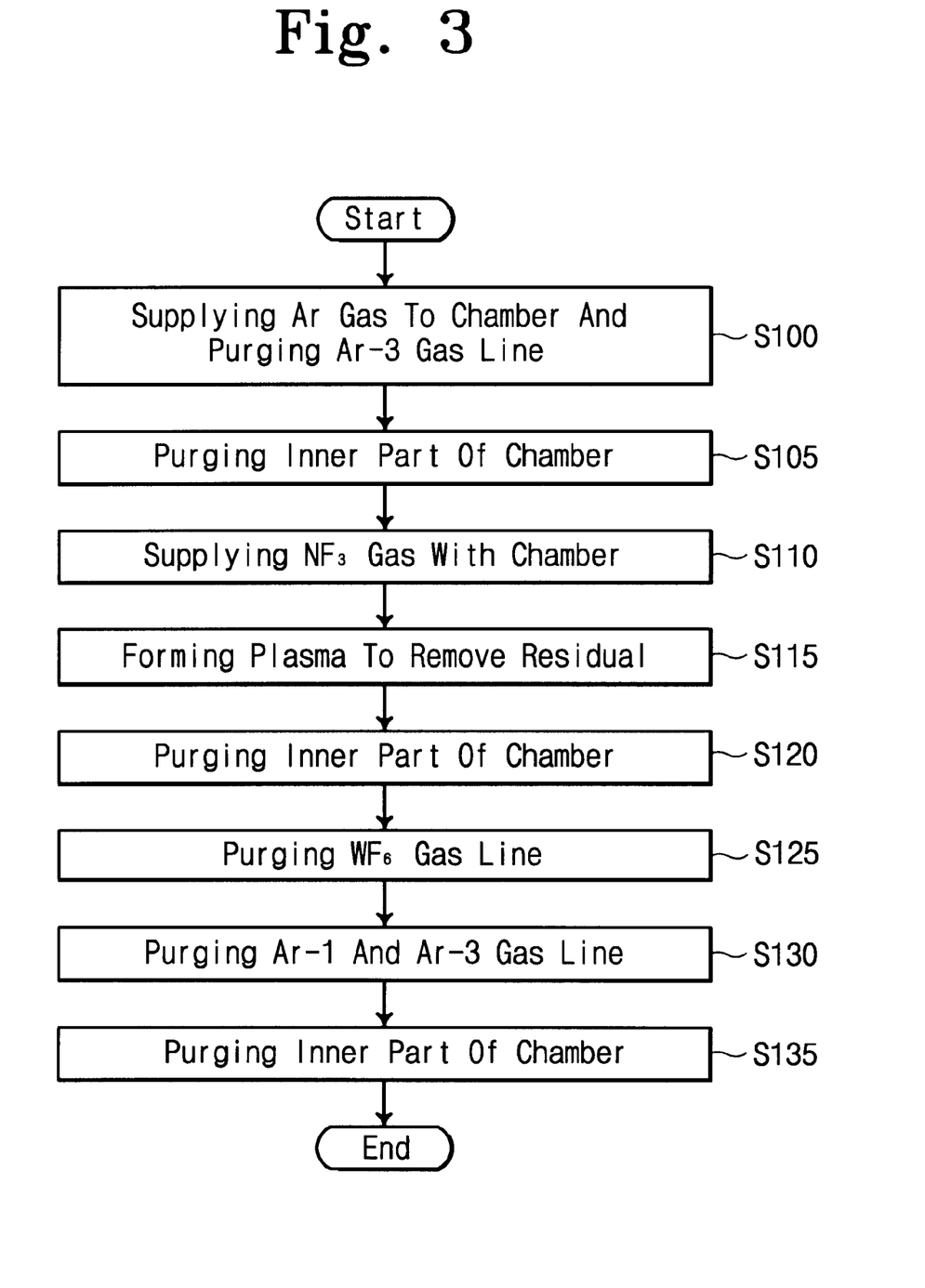
FIG. 3 is a flowchart showing a method to remove a particulate contaminant in a tungsten silicide deposition process according to a first preferred embodiment of the present invention.

FIG. 3 is a flowchart showing a method to remove particulate contaminant in a tungsten silicide deposition process according to a first preferred embodiment of the present invention.

In the first preferred embodiment, the method is applied to the conventional CVD system shown in FIG. 1. As shown in FIG. 3, the chamber 10 is initially supplied with Ar-1 and Ar-4 gas and the Ar-3 gas lines are purged (step S100). At this point, the valves 40, 42, and 106 on the Ar-3 gas line 26 remain open as any residual gas in the gas line 26 is exhausted by pumping force. To accomplish step S100 and to purge the Ar-3 carrier gas line 26, the valve 102 is closed to cut off the supply of Ar to gas line 26 and Ar is continuously supplied to the chamber through the Ar carrier gas line 36 and Ar-1 carrier gas line 12. This gas supply is preferably is maintained for about 30 seconds.

Next, the valves 104, 106, and 38 are closed, preferably for about 15 seconds, to purge the chamber 10 in step S105. At this point, the valve 54 remains open. The valve 108 on the $NF_3$ gas line 18 is then opened to allow the $NF_3$ gases to flow into the chamber 10 through lines 18 and 12 in step S110.

The conditions of the chamber are then adjusted to a predetermined setting, and plasma is formed to clean any residual from the deposition process in step S115.

Valves 104, 106 and 38 are then closed in step S120 to purge the chamber, preferably for about 10 seconds, and then valves 104, 106 and 50 are closed, preferably for about 30 seconds, to allow the $WF_6$ gas line to be purged through lines 12 and 24 in step S125. At this point, the valve 54 remains open. This purging is prompted by the fact that gas, e.g., $NF_3$ gas, may remain in gas lines 12 and 24.

Next, valves 102 and 50 on the Ar-1 gas line 12 are closed to purge lines 26 and 12, and Ar gas is allowed to flow through line 36 in step S130. This purging of the gas lines is preferably maintained for at least twenty seconds to ensure high purity. Finally, valves 104, 106 and 38 are closed to purge the chamber 10 in step S135. At this point, the valve 54 remains open.

This method for removing particulate contaminants in a tungsten silicide deposition process according to a first preferred embodiment of the present invention may be performed just before the deposition process, or as the chamber is in an idle state when the deposition process is paused. The method may also be performed at regular time intervals during processing. Performing the method just before the deposition process make the inner chamber and gas lines completely cleaned, and performing the method during an idle state makes the contaminant in the chamber and gas lines completely removed.

Figure 4:
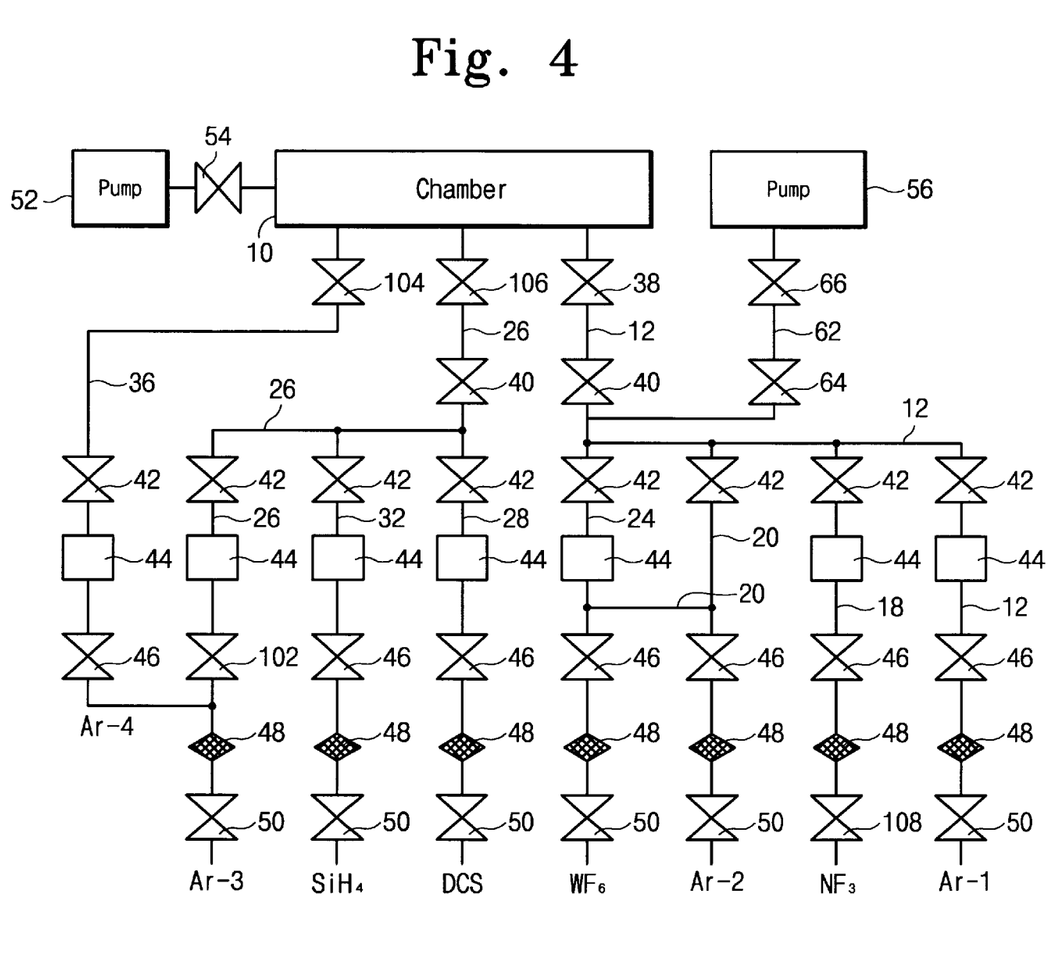
FIG. 4 is a diagram showing a chemical vapor deposition system to remove particulate contaminants in a tungsten silicide deposition process according to a second preferred embodiment of the present invention.
Figure 5:
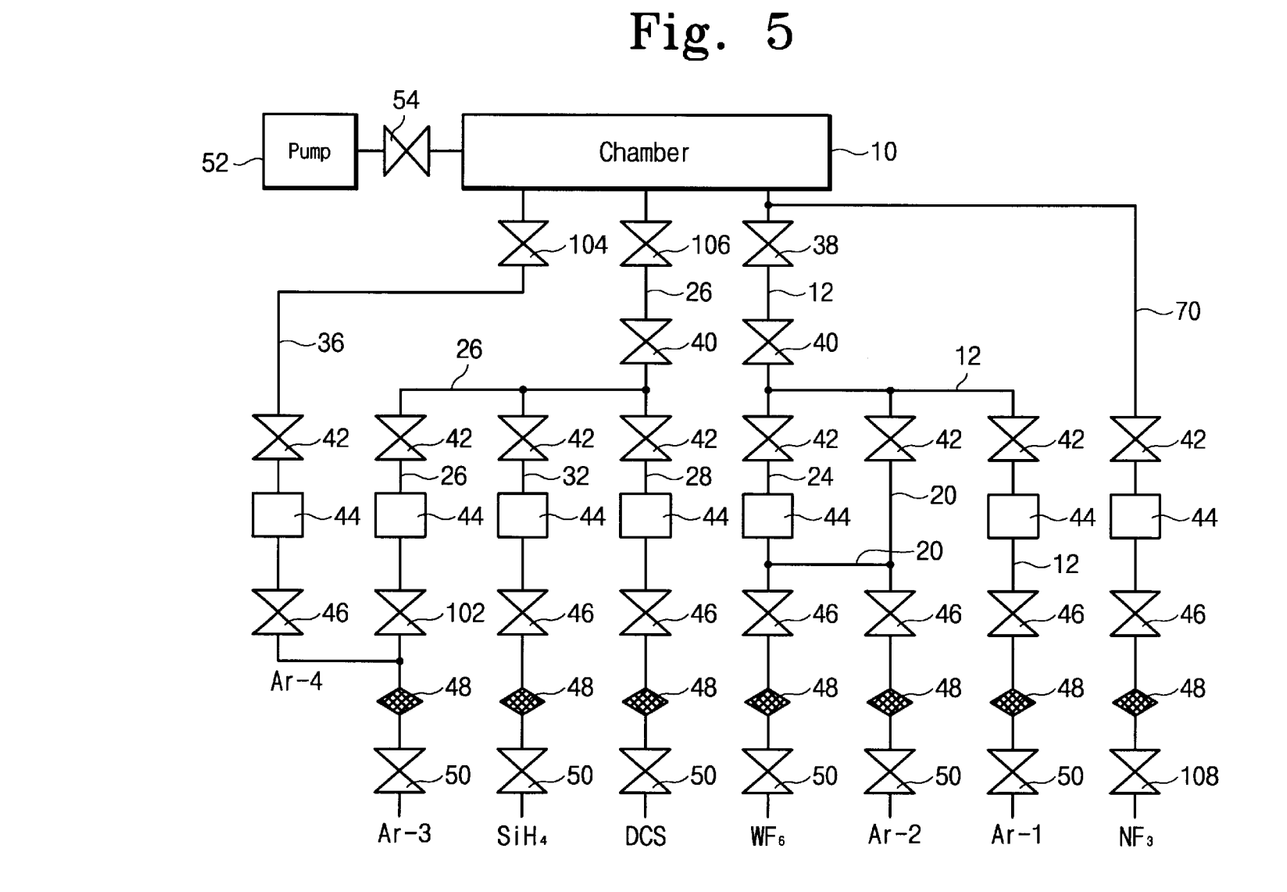
FIG. 5 is a diagram showing a chemical vapor deposition system to remove particulate contaminant in a tungsten silicide deposition process in accordance with a third preferred embodiment of the present invention.

FIG. 4 and FIG. 5 are a diagram showing chemical vapor deposition systems to remove particulate contaminant in tungsten silicide deposition process according to second and third preferred embodiments of the present invention.

Referring to FIG. 4, a chemical vapor deposition system in accordance with the second preferred embodiment of the invention is similar to that of the conventional CVD system, and similar elements have the same reference numerals. However, the CVD system of the second preferred embodiment further includes another exhaust line 62 and pump 52 relative to the conventional CVD system, as shown in FIG. 4. The exhaust line 62 is preferably connects to the Ar-1 carrier gas line 12, and is coupled to a pump 56 used to pump air from the chamber 10.

Valves 64 and 66 are located in the exhaust line 62 and are controlled by the controller (not shown). To achieve the desired effect in the second preferred embodiment, it is necessary to purge the Ar-1 carrier gas line 12 through the exhaust line 62. Generally the gases used in the CVD system flow into the chamber 10, and are then exhausted outside the chamber 10 by pumping force through the valve 54 and pump 52. But during purging of the Ar-1 carrier gas line 12, the gases flowing through the Ar-1 carrier gas line 12 are allowed to exhaust outside through the exhaust line 62 and not through the chamber 10. In this way, any remaining $NF_3$ gas in the Ar-1 carrier gas line 12 is eliminated.

The CVD system in accordance with the second preferred embodiment of the invention may be used with the method described in detail above with reference to FIG. 3.

FIG. 5 shows a chemical vapor deposition system in accordance with a third preferred embodiment of the current invention. As with FIG. 4, similar elements are designated with the same reference numerals.

Referring to FIG. 5, in the third preferred embodiment, an $NF_3$ cleaning gas line 70 is directly connected to the chamber 10 in the chemical vapor deposition system. The $NF_3$ cleaning gas is thus supplied to the chamber via the independent $NF_3$ cleaning gas line 70. At this point, the valves 42, 46, and 108 on the $NF_3$ gas line 70 remain open. Since no $NF_3$ gas is supplied through the Ar-1 carrier gas line 12, there is no problem with $NF_3$ gas remaining in the Ar-1 carrier gas line 12.

Figure 6:
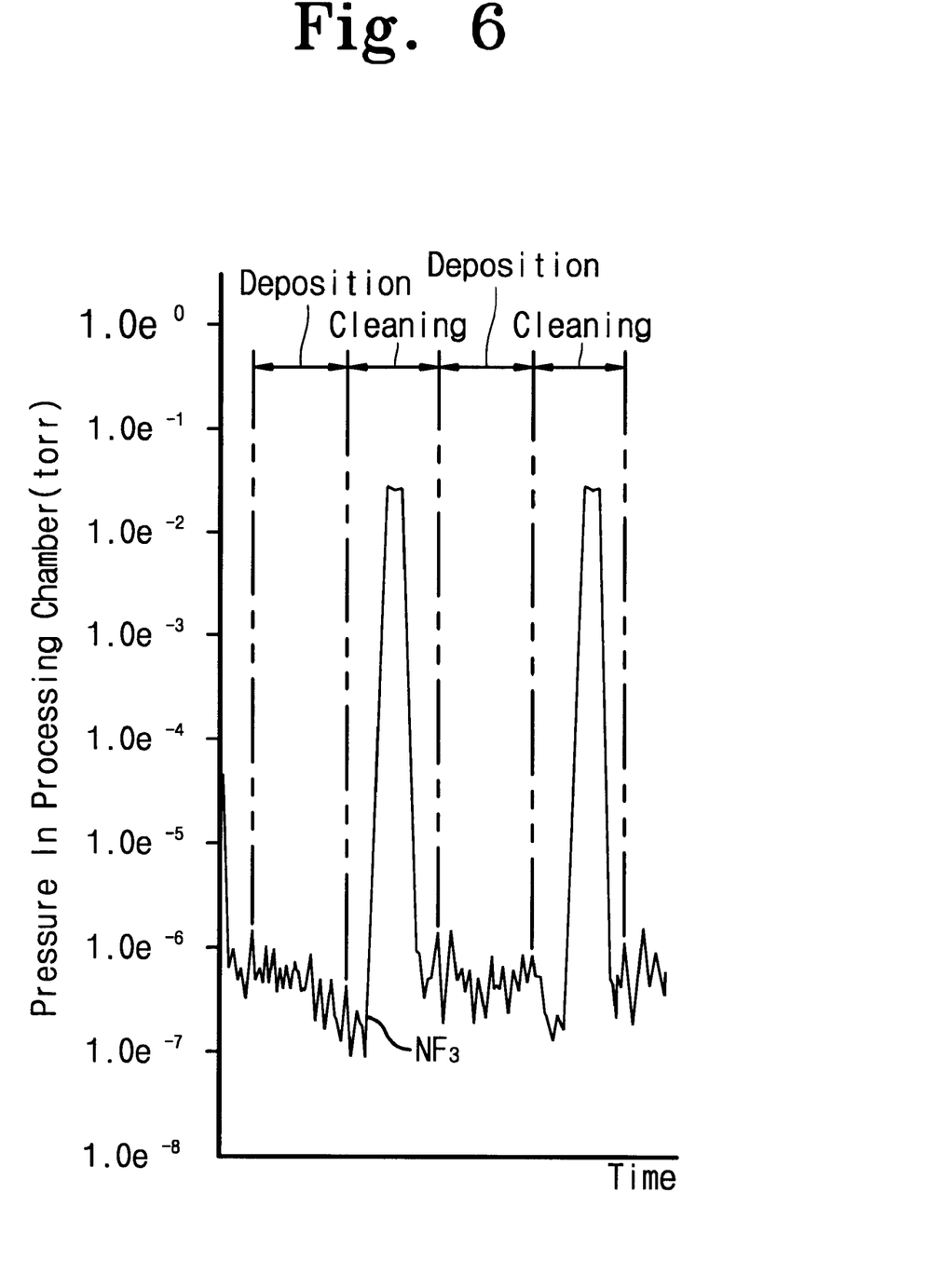
FIG. 6 is a graph detecting the pressure of $NF_3$ in the chamber in accordance with the method of the preferred embodiment of the present invention.

FIG. 6 is a graph detecting the pressure of $NF_3$ in the chamber applied to the method of the first preferred embodiment of the present invention.

As shown in FIG. 6, the fluctuation of pressure of $NF_3$ gas shows a regular pattern. Compared to the pressure shown in FIG. 2, the pressure of $NF_3$ is maintained at a constant level (e.g., $1 \times 10^{-6}$) in the initial deposition step. Therefore it is concluded that $NF_3$ cleaning gas does not remain in the gas line between the cleaning step and the deposition step.

Thus, the method and apparatus of the invention provides for removing any contaminant remaining in the gas line during the manufacturing of a semiconductor. As a result, the contamination of a semiconductor device is prevented during the process. In accordance with this method for removing particulate contaminant, a cleaning gas such as $NF_3$ in the chamber 10 remains at a level small enough that it has no effect when the cleaning process is finished and the deposition process is commenced. Therefore, particulate contaminants are removed or remain at a minimum level having no effect on the tungsten silicide deposition process. As a result, yield of semiconductor device is improved in tungsten silicide deposition process.

The present invention has been described by way of a specific exemplary embodiment, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation ad illustrated and described. Hence, all suitable modifications and equivalents may be resorted to as falling within the scope of the invention.

What is claimed is:

1. A method for removing particulate contaminants in a silicide deposition process, comprising:

purging a first carrier gas line to remove contaminants from a chamber and the first carrier gas line by supplying a carrier gas to the chamber via a second carrier gas line;

supplying a cleaning gas into the chamber;

forming a plasma in the chamber from the cleaning gas; and purging a reaction gas line for flowing a reaction gas to remove any contaminants in the chamber and the reaction gas line, whereby particulate contamination by the cleaning gas is prevented in the deposition process.

2. A method for removing particulate contaminants in a silicide deposition process, as recited in claim 1, further comprising flowing a silicon source gas into the chamber, wherein the silicon source gas is $SiH_4$.

3. A method for removing particulate contaminants in a silicide deposition process, as recited in claim 1, wherein the cleaning gas is $NF_3$.

4. A method for removing particulate contaminants in a silicide deposition process, as recited in claim 1, wherein the reaction gas is $WF_6$.

5. A method for removing particulate contaminants in a silicide deposition process, as recited in claim 1, wherein the carrier gas is argon.

6. A method for removing particulate contaminants in a silicide deposition process, as recited in claim 1, further comprising purging an inner part of the chamber after purging the first carrier gas line.

7. A method for removing particulate contaminants in a silicide deposition process, as recited in claim 1, further comprising purging an inner part of the chamber before and after supplying the cleaning gas into the chamber and forming a plasma in the chamber from the cleaning gas.

8. A method for removing particulate contaminants in a silicide deposition process, as recited in claim 1, further comprising flowing a silicon source gas into the chamber, wherein the flowing of the silicon source gas into the chamber, purging the first carrier gas line to, supplying the cleaning gas, forming a plasma in the chamber, and purging the reaction gas line are performed just before a deposition process.

9. A method for removing particulate contaminants in a silicide deposition process, as recited in claim 1, further comprising flowing a silicon source gas into the chamber, wherein the flowing of the silicon source gas into the chamber, purging the first carrier gas line to, supplying the cleaning gas, forming a plasma in the chamber, and purging the reaction gas line are performed periodically at regular time intervals when the chamber is in an idle state during which a deposition process is paused.

10. A chemical vapor deposition system for a silicide deposition process, comprising:

a chamber for performing a silicide deposition process;

a first carrier gas line for supplying a carrier gas to the chamber;

a source gas line connected to the first carrier gas line for supplying a silicon source gas to the first carrier gas line and to the chamber via the first carrier gas line;

a second carrier gas line for supplying the carrier gas to the chamber;

a reaction gas line connected to the second carrier gas line for supplying a reaction gas to the second carrier gas line and to the chamber via the second carrier gas line; and a purging device for preventing a cleaning gas from remaining in the second carrier gas line and the reaction gas line and from acting as a particulate contaminant during the silicide deposition process.

11. A chemical vapor deposition system, as recited in claim 10, wherein the purging device comprises a cleaning gas line connected directly with the chamber to provide the cleaning gas to the chamber.

12. A chemical vapor deposition system, as recited in claim 11, wherein the second carrier gas line provides the reaction gas, carrier gas, and cleaning gas to an upper zone of the chamber.

13. A chemical vapor deposition system, as recited in claim 10, wherein the purging device comprises:

a cleaning gas line connected to the second carrier gas line for supplying the cleaning gas to the second carrier gas line and to the chamber via the second carrier gas line; and an exhaust line connected to the second carrier gas line, and exhausting the cleaning gas from the reaction gas line, the second carrier gas line, and cleaning gas line, whereby the exhaust line is connected to the second carrier gas line adjacent to the cleaning gas line.

14. A chemical vapor deposition system, as recited in claim 13, wherein the second carrier gas line provides the reaction gas, carrier gas, and cleaning gas to an upper zone of the chamber.

15. A chemical vapor deposition system, as recited in claim 13, wherein the exhaust line is connected to a pump.

16. A chemical vapor deposition system, as recited in claim 10, further comprising a third carrier gas line divided from the first carrier gas line before the first carrier gas line is connected with the source gas line, the third carrier gas line being connected to the chamber to provide the carrier gas to a bottom zone of the chamber.

17. A chemical vapor deposition system, as recited in claim 10, wherein the silicon source gas is $SiH_4$.

18. A chemical vapor deposition system, as recited in claim 10, wherein the cleaning gas is $NF_3$.

19. A chemical vapor deposition system, as recited in claim 10, wherein the carrier gas is argon.

20. A chemical vapor deposition system, as recited in claim 10, wherein the reaction gas is $WF_6$.

* * * * *